US010110197B2

United States Patent
Shin et al.

(10) Patent No.: US 10,110,197 B2
(45) Date of Patent: Oct. 23, 2018

(54) BULK ACOUSTIC WAVE RESONATOR AND FILTER

(71) Applicant: Samsung Electro-Mechanics Co., Ltd., Suwon-si (KR)

(72) Inventors: Jea Shik Shin, Suwon-si (KR); Sang Uk Son, Suwon-si (KR); Duck Hwan Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/934,619

(22) Filed: Nov. 6, 2015

(65) Prior Publication Data

US 2016/0164489 A1    Jun. 9, 2016

(30) Foreign Application Priority Data

Dec. 8, 2014 (KR) .................. 10-2014-0175270

(51) Int. Cl.
*H03H 9/17* (2006.01)
*H03H 9/54* (2006.01)
(Continued)

(52) U.S. Cl.
CPC ........ *H03H 9/173* (2013.01); *H03H 9/02102* (2013.01); *H03H 9/587* (2013.01);
(Continued)

(58) Field of Classification Search
CPC .... H03H 9/02102; H03H 9/173; H03H 9/174; H03H 9/175; H03H 9/587; H03H 9/588;
(Continued)

(56) References Cited

U.S. PATENT DOCUMENTS 5,873,154 A * 2/1999 Ylilammi .................. H03H 3/02
29/25.35
6,051,907 A * 4/2000 Ylilammi .................. H03H 3/04
310/312
(Continued)

FOREIGN PATENT DOCUMENTS

JP    2001-127584 A  *  5/2001
JP    2002-198856 A      7/2002
(Continued)

OTHER PUBLICATIONS

English language machine translation of JP 2001-127584 A, published May 11, 2001, 7 pages.*
(Continued)

*Primary Examiner* — Barbara Summons
(74) *Attorney, Agent, or Firm* — NSIP Law

(57) ABSTRACT

A bulk acoustic wave resonator and a filter in which partial thicknesses of protection layers or reflection layers thereof are differently formed are provided. The bulk acoustic wave resonator includes a bulk acoustic wave resonating part comprising a piezoelectric layer, and a reflection layer configured to reflect waves of a resonance frequency generated by the piezoelectric layer based on a signal applied to the bulk acoustic wave resonating part. A thickness of a portion of the reflection layer is different from a thickness of a remaining portion thereof.

20 Claims, 7 Drawing Sheets

(51) Int. Cl.
  *H03H 9/58* (2006.01)
  *H03H 9/02* (2006.01)
  *H03H 3/02* (2006.01)

(52) U.S. Cl.
  CPC ............. *H03H 9/175* (2013.01); *H03H 9/589* (2013.01); *H03H 2003/021* (2013.01)

(58) Field of Classification Search
  CPC ............. H03H 9/589; H03H 2003/021; H03H 2003/023; H03H 2003/025
  USPC ......... 333/187, 189; 310/335, 346, 348, 349
  See application file for complete search history.

(56) References Cited

U.S. PATENT DOCUMENTS

| | | | | |
|---|---|---|---|---|
| 6,107,721 A * | 8/2000 | Lakin | .................... | H03H 9/564 310/321 |
| 6,407,649 B1 * | 6/2002 | Tikka | .................. | H03H 9/0571 29/25.35 |
| 6,441,703 B1 * | 8/2002 | Panasik | .................. | H03H 9/589 29/25.35 |
| 7,439,824 B2 * | 10/2008 | Aigner | ............... | H03H 9/02118 333/187 |
| 7,541,717 B2 * | 6/2009 | Schmidhammer | .......................... H03H 9/02118 | 310/320 |
| 7,561,009 B2 | 7/2009 | Larson, III et al. | | |
| 7,639,103 B2 * | 12/2009 | Yamakawa | .............. | H03H 3/04 310/349 |
| 2003/0193269 A1 * | 10/2003 | Jang | ......................... | H03H 3/04 310/346 |
| 2003/0218518 A1 * | 11/2003 | Lee | .......................... | H03H 3/04 333/189 |
| 2005/0023932 A1 * | 2/2005 | Inoue | .................. | H03H 9/02102 310/327 |
| 2005/0134147 A1 * | 6/2005 | Nakamura | .............. | H03H 9/586 310/334 |
| 2007/0279152 A1 * | 12/2007 | Kawamura | .............. | H03H 3/04 333/187 |
| 2011/0266925 A1 | 11/2011 | Ruby et al. | | |
| 2013/0038408 A1 * | 2/2013 | Burak | .................... | H03H 9/132 333/187 |
| 2013/0140959 A1 * | 6/2013 | Shin | ....................... | H03H 9/173 310/349 |
| 2013/0181579 A1 | 7/2013 | Shin et al. | | |

FOREIGN PATENT DOCUMENTS

| | | | |
|---|---|---|---|
| JP | 2008-219237 A | * | 9/2008 |
| KR | 10-2011-0120839 A | | 11/2011 |
| KR | 10-2013-0084860 A | | 7/2013 |

OTHER PUBLICATIONS

English language machine translation of JP 2008-219237 A, published Sep. 18, 2008, 13 pages.*

* cited by examiner

BULK ACOUSTIC WAVE RESONATOR AND FILTER

CROSS-REFERENCE TO RELATED APPLICATION

This application claims the priority and benefit under 35 USC 119(a) of Korean Patent Application No. 10-2014-0175270 filed on Dec. 8, 2014, with the Korean Intellectual Property Office, the disclosure of which is incorporated herein by reference.

BACKGROUND

1. Field

The following description relates to a bulk acoustic wave resonator and a filter.

2. Description of Related Art

Due to limitations on frequency resources for mobile communications systems, such as cellular phone networks, an amount of a usable frequency is very limited and, as a result, very costly for an end user.

Transmission frequencies and reception frequencies having a predetermined amount of band gap therebetween have been used in order to avoid interference between transmitted and received signals.

As described above, because it is very costly to obtain usable frequencies, it is important to ensure that the usable frequencies are effectively and efficiently allocated and used. As a result, there is a need to reduce band gaps between transmission frequencies and reception frequencies in order to efficiently use frequency resources.

In a general wireless communications system, band gaps are reduced by implementing a duplexer separating a transmitted signal and a received signal from each other, but high quality factor (QF) is required.

In addition, the wireless communications needs to be stable regardless of ambient temperature. A temperature coefficient of frequency (TCF) is a temperature of a wireless signal filter. In order to implement stable wireless communications, a frequency change depending on a TCF is very important. An apparatus and method that allows a TCF value of the wireless signal filter to be close to '0' is required. Furthermore, the wireless signal filter uses a bulk acoustic wave resonator. A temperature compensation layer may be added to implement a low TCF value, but a noise peak may occur in an unwanted frequency band by the temperature compensation layer.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided a bulk acoustic wave resonator, including: a bulk acoustic wave resonating part including a piezoelectric layer; and a reflection layer configured to reflect waves of a resonance frequency generated by the piezoelectric layer based on a signal applied to the bulk acoustic wave resonating part, wherein a thickness of a portion of the reflection layer is different from a thickness of a remaining portion thereof.

The reflection layer may be disposed on at least one of an upper portion and a lower portion of the bulk acoustic wave resonating part.

The reflection layer may include: a first reflection layer including a first acoustic impedance; and a second reflection layer including a second acoustic impedance, higher than the first acoustic impedance.

A thickness of a portion of at least one of the first reflection layer and the second reflection layer may be different from a thickness of a remaining portion.

The bulk acoustic wave resonator may also include a protection layer deposited on a substrate.

The bulk acoustic wave resonator part may be formed above the protection layer and the protection layer is formed below the reflection layer.

A thickness of a portion of the protection layer may be different from a thickness of a remaining portion thereof.

The reflection layer may be formed of regions, each having different thicknesses from a center thereof to an outer portion thereof.

The reflection layer may be formed of regions evenly divided, where the thicknesses of the regions are different.

In accordance with an embodiment, there is provided a bulk acoustic wave resonator including: a bulk acoustic wave resonating part stacked on a substrate and including a piezoelectric layer; a reflection layer configured to reflect waves of a resonance frequency generated by the piezoelectric layer based on a signal applied to the bulk acoustic wave resonating part; a protection layer deposited on the substrate, wherein a thickness of a portion of at least one of the reflection layer and the protection layer is different from a thickness of a remaining portion thereof.

The reflection layer may be disposed on at least one of an upper portion and a lower portion of the bulk acoustic wave resonating part.

The reflection layer may include: a first reflection layer including first acoustic impedance; and a second reflection layer including a second acoustic impedance, higher than the first acoustic impedance.

A thickness of a portion of at least one of the first reflection layer and the second reflection layer may be different from a thickness of a remaining portion thereof.

In accordance with an embodiment, there is provided a filter, including: bulk acoustic wave resonators configured to filter an input signal into frequency bands, wherein each of the bulk acoustic wave resonators may include a bulk acoustic wave resonating part configured to produce a resonance frequency, and a reflection layer configured to reflect waves of the resonance frequency, and wherein a thickness of a reflection layer of one of the bulk acoustic wave resonators is different from thicknesses of reflection layers of remaining bulk acoustic wave resonators.

A thickness of a portion of the reflection layer of the one of the bulk acoustic wave resonators may be different from a thickness of a remaining portion thereof.

The bulk acoustic wave resonators may be configured in a ladder-type arrangement or a lattice-type arrangement.

In accordance with an embodiment, there is provided a filter, including: bulk acoustic wave resonators configured to filter an input signal into frequency bands, wherein each of the bulk acoustic wave resonators may include a bulk acoustic wave resonating part configured to produce a resonance frequency, a reflection layer configured to reflect waves of the resonance frequency, and a protection layer deposited on a substrate, and wherein a thickness of at least one of a reflection layer and a protection layer of one of the bulk acoustic wave resonators is different from thicknesses of reflection layers or protection layers of remaining bulk acoustic wave resonators.

A thickness of a portion of at least one of the reflection layer and the protection layer of the one of the bulk acoustic wave resonators may be different from a thickness of a remaining portion thereof.

The bulk acoustic wave resonators may be configured in a ladder-type arrangement or a lattice-type arrangement.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
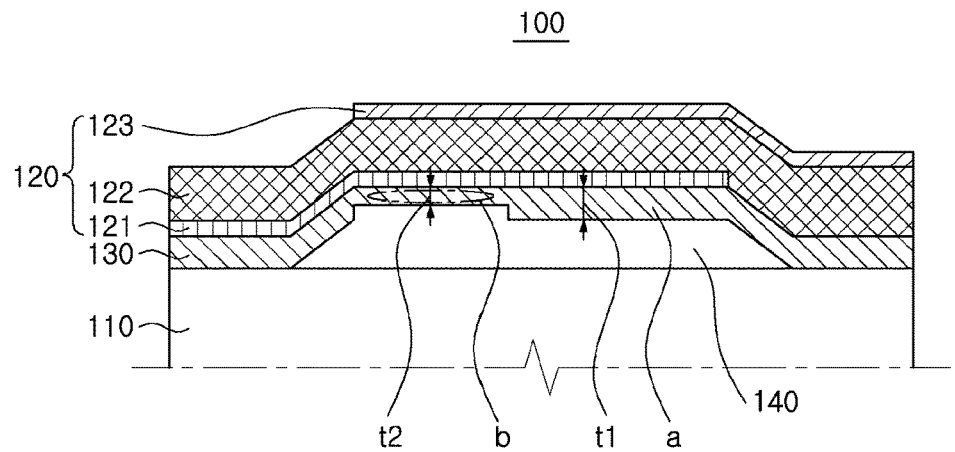
FIG. 1 is a diagram illustrating a structure of a bulk acoustic wave resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

In the drawings, the shapes and dimensions of elements may be exaggerated for clarity, and the same reference numerals will be used throughout to designate the same or like elements.

FIG. 1 is a diagram illustrating a structure of a bulk acoustic wave resonator, according to an embodiment.

Referring to FIG. 1, a bulk acoustic wave resonator 100, according to an embodiment a substrate 110, a bulk acoustic wave resonating part 120, a reflection layer 130, and an air cavity 140.

The substrate 110 is formed in a silicon or silicon on insulator (SOI) type. The bulk acoustic wave resonating part 120 includes a first electrode 121, a piezoelectric layer 122, and a second electrode 123.

Electrical energy is applied to the first electrode 121 and the second electrode 123 to induce an electric field, which is temporally changed in the piezoelectric layer 12. The electric field produces a bulk acoustic wave in the same direction as a vibration direction of the bulk acoustic wave resonating part 120 within the piezoelectric layer 122, thereby generating a resonance frequency.

The reflection layer 130 is formed of a material having temperature coefficient of frequency (TCF) characteristics so that a summation of a TCF value of the bulk acoustic wave resonating part 120 and a TCF value of the reflection layer 130 has a value that is close to zero.

In one example, to ensure that the TCF values of the bulk acoustic wave resonating part 120 and the reflection layer sum to be close to zero, the reflection layer 130 is formed to include at least one material having TCF characteristics having a sign opposing to that of the TCF value of the bulk acoustic wave resonating part 120. In other words, in a case in which the TCF value of the bulk acoustic wave resonating part 120 is negative (−), the reflection layer 130 may be formed of a material having a TCF value of positive (+).

The reflection layer 130 may be formed of a silicon oxide based material, a silicon nitride based material, an aluminum oxide based material, or an aluminum nitride based material. For example, the reflection layer 130 may be formed of a material such as $SiO_2$, $Si_3N_4$, ZnO, AlN, Al, Au, and $Al_2O_3$.

In addition, the reflection layer 130 may be formed of a material including a compound of at least one or at least two of molybdenum (Mo), ruthenium (Ru), tungsten (W), and platinum (Pt).

The reflecting layer 130 reflects waves of a resonance frequency generated by the piezoelectric layer 122 based on a signal applied to the first electrode 121 and the second electrode 123.

In one example, the reflection layer 130 is formed to have a thickness which is close to ¼ of a wavelength of the resonance frequency generated by the piezoelectric layer 122, depending on a voltage applied to the first electrode 121 and the second electrode 123. In accordance with other examples, the reflection layer 130 is formed of various thicknesses close to a portion of a wavelength of the resonance frequency generated by the piezoelectric layer 122, depending on the voltage applied to the first electrode 121 and the second electrode 123.

For example, the reflection layer 130 includes a first reflection layer disposed below the first electrode 121 and has low acoustic impedance characteristics. The reflection layer 130 also includes a second reflection layer disposed below the first reflection layer and has high acoustic impedance characteristics. The first and second reflection layers are later described with reference to the accompanying drawings.

The acoustic wave is generated in a direction from the second electrode 123 to the first electrode 121 through a coupled structure of the first reflection layer and the second reflection layer. Such acoustic wave is not lost by the air cavity 140 due to a difference of acoustic wave impedance and total reflection, so as to be maintained in the piezoelectric layer 122. The air cavity 140 blocks leakage energy transferred to the substrate 110.

Further, in one example, a thickness t2 of a portion b of the reflection layer 130 is different from a thickness t1 of a remaining portion a. This thickness difference reduces magnitude of a peak of a specific frequency band by diffusing a frequency peak. Thus, a peak of an unwanted frequency band is reduced. In one configuration, the thickness t2 of the portion be of the reflection layer 130 may be greater than the thickness t1 of the remaining portion a. In a further configuration, the thickness t2 of the portion of the reflection layer 130 may be smaller than the thickness t1 of the remaining portion a.

Figure 2A:
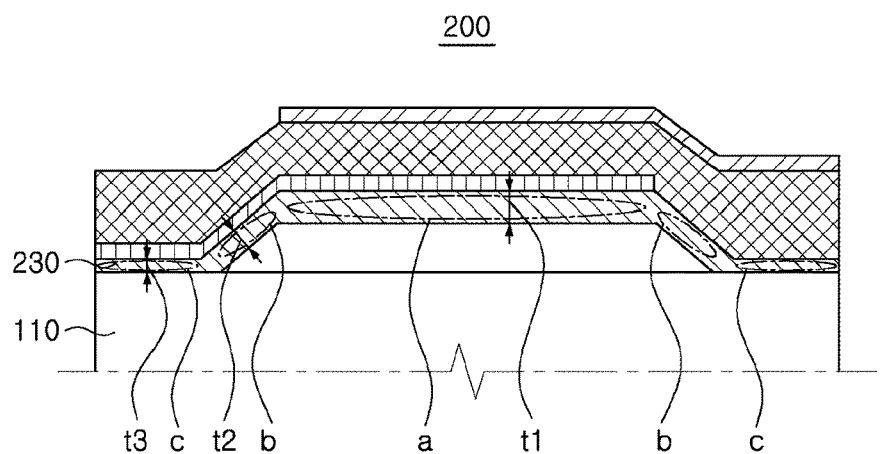
FIG. 2A is a diagram illustrating a structure of a bulk acoustic wave resonator, according to another embodiment.
Figure 2B:
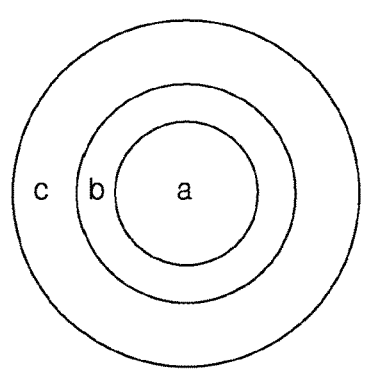
FIGS. 2B and 2C are plan views of a reflection layer or a protection layer of the bulk acoustic wave resonator, according to another embodiment.
Figure 2C:
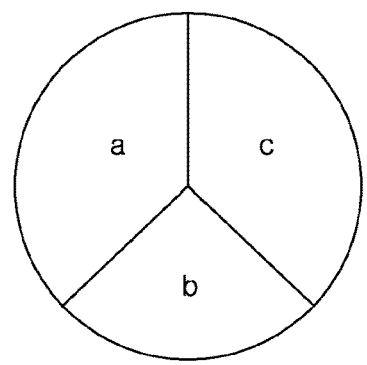

FIG. 2A is a diagram illustrating a structure of a bulk acoustic wave resonator 200, according to another embodiment, and FIGS. 2B and 2C are plan views of a reflection layer or a protection layer of the bulk acoustic wave resonator 200, according to another embodiment.

Referring to FIG. 2A, a reflection layer 230 of a bulk acoustic wave resonator 200, according to another embodiment, is formed of, for example, three regions a, b, and c having different thicknesses t1, t2, and t3, respectively.

As illustrated in FIG. 2B, the reflection layer 230 is divided into the three regions a, b, and c having different thicknesses from a center thereof to an outer portion thereof. As illustrated in FIG. 2C, the three regions are evenly divided, such that the thicknesses of the respective regions are different.

The bulk acoustic wave resonator 200 described above further includes the protection layer in addition to the reflection layer. A thickness of a portion of the protection layer is different from a thickness of a remaining portion. In an example, thicknesses of all regions of the reflection layer are constant, while only a thickness of a portion of the protection layer are different from a thickness of a remaining portion.

A description thereof will be provided below with reference to the accompanying drawings.

FIGS. 3 through 10 are diagrams illustrating structures of bulk acoustic wave resonators, according to embodiments.

Figure 3:
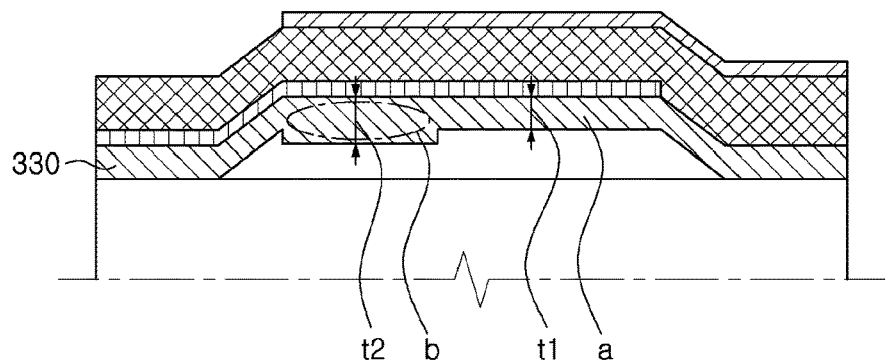
FIGS. 3 through 10 are diagrams illustrating structures of bulk acoustic wave resonators, according to exemplary in the present disclosure.

On the contrary to a case in which the thickness t2 of the portion b of the reflection layer 130 is thinner than the thickness t1 of the remaining portion a in FIG. 1. In FIG. 3, a thickness t2 of a portion b of a reflection layer 330 of a bulk acoustic wave resonator 300, according to an embodiment, is thicker than a thickness t1 of a remaining portion a.

Figure 4:
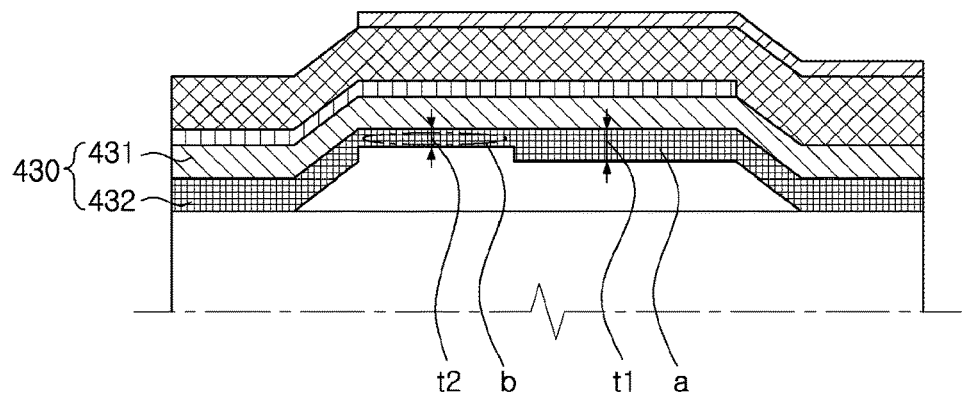

Referring to FIG. 4, a reflection layer 430 of a bulk acoustic wave resonator 400, according to an embodiment, is formed of or includes a coupled structure of reflection layers having at least two acoustic impedance characteristics. A first reflection layer 431 has relatively low acoustic impedance, and a second reflection layer 432 has relatively high acoustic impedance.

A thickness t2 of a portion b of the second reflection layer 432 are different from a thickness t1 of a remaining portion a.

Figure 5:
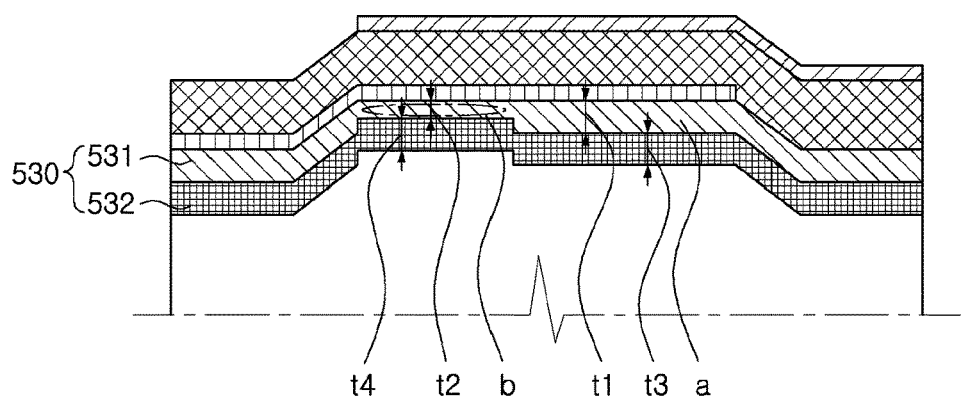

Referring to FIG. 5, a thickness t2 of a portion b of a first reflection layer 531 of a reflection layer 530 of a bulk acoustic wave resonator 500, according to an embodiment, is different from a thickness t1 of a remaining portion a.

Figure 6:
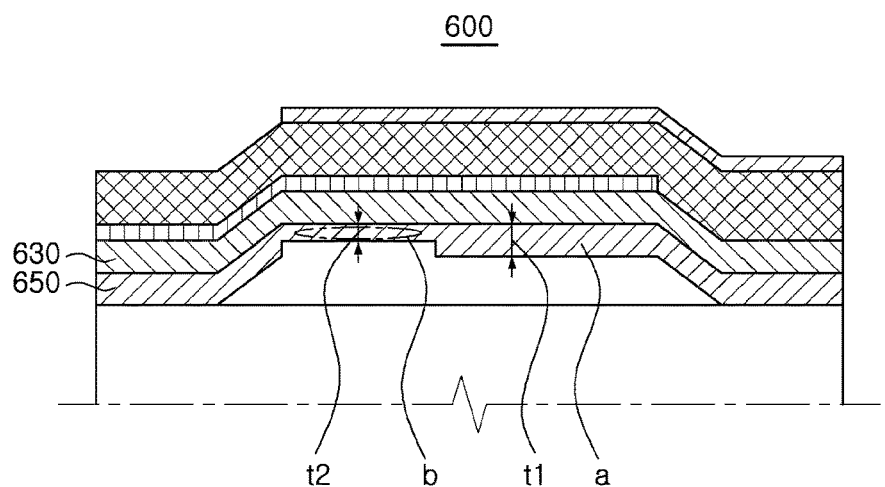

Referring to FIG. 6, a bulk acoustic wave resonator 600, according to an embodiment, includes a protection layer 650 below a reflection layer 630.

The protection layer 650 serves as an etching stop layer in an etching process to form an air cavity.

Although not illustrated, in a case in which the bulk acoustic wave resonator 600, according to an embodiment, further includes a membrane layer, the membrane layer may be formed of silicon oxide.

As illustrated in FIG. 6, a thickness t2 of a portion b of the protection layer 650 is different from a thickness t1 of a remaining portion a.

Figure 7:
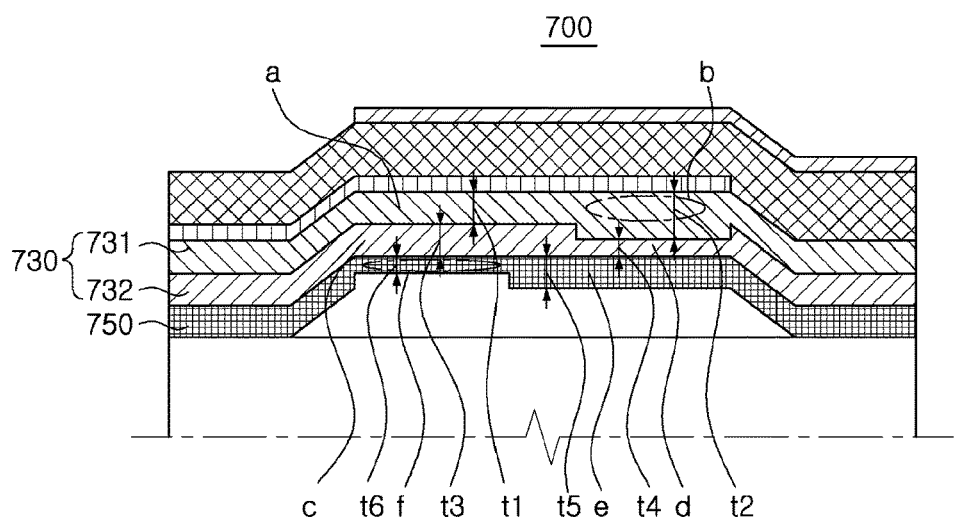

Referring to FIG. 7, thicknesses t2, t4, and t6 of portions b, d, and f of first and second reflection layers 731 and 732 of a reflection layer 730 and a protection layer 750 of a bulk acoustic wave resonator 700, according to an embodiment, are different from thicknesses t1, t3, and t5 of remaining portions a, c, and e.

Figure 8:
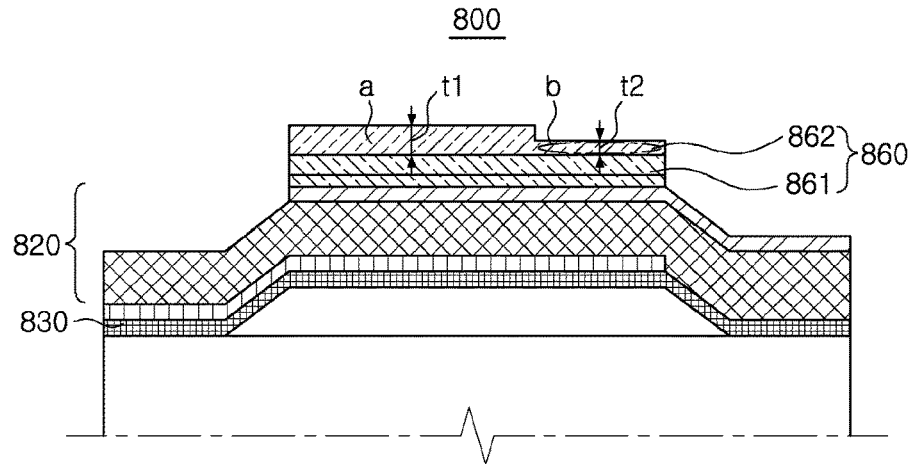

Referring to FIG. 8, a reflection layer 860 is formed on a bulk acoustic wave resonating part 820 of a bulk acoustic wave resonator 800, according to an embodiment, and a thickness t2 of a portion b of at least one of first and second reflection layers 861 and 862 of the reflection layer 860 are different from a thickness t1 of a remaining portion a.

In addition, the reflection layer 830 is also formed below the bulk acoustic wave resonating part 820.

Figure 9:
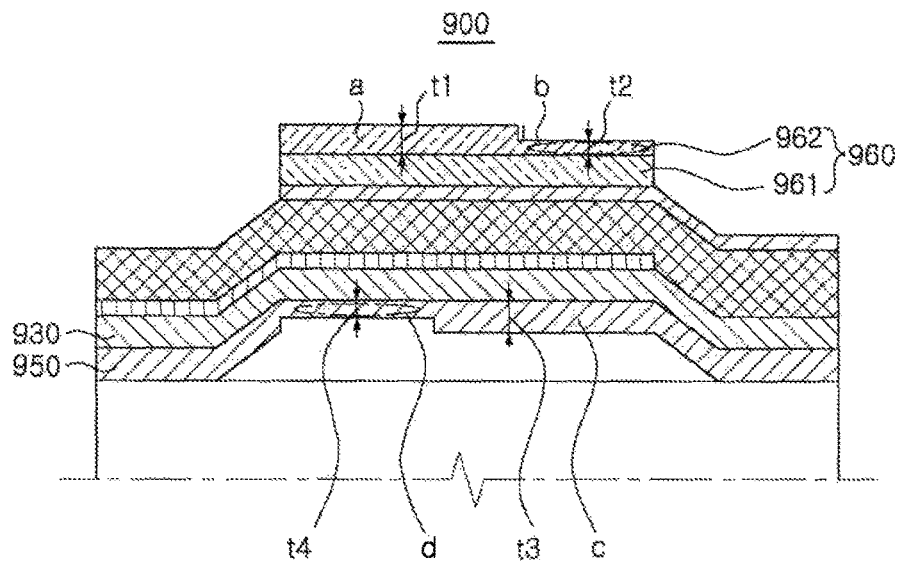

Referring to FIG. 9, a reflection layer 960 is formed on a bulk acoustic wave resonating part 920 of a bulk acoustic wave resonator 900, according to an embodiment, and a thickness t2 of a portion b of at least one of first and second reflection layers 961 and 962 of the reflection layer 960 is different from a thickness t1 of a remaining portion a.

In addition, a protection layer 950 is formed below the reflection layer 930, which is formed below the bulk acoustic wave resonating part 920. A thickness t4 of a portion d of the protection layer 950 is different from a thickness t3 of a remaining portion a.

Figure 10:
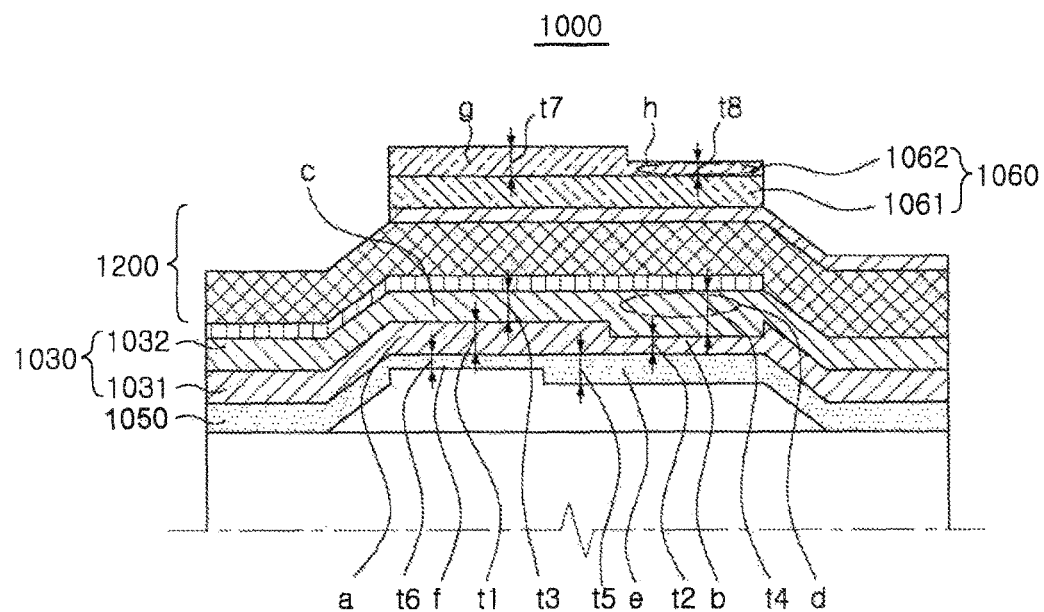

Referring to FIG. 10, a reflection layer 1060 is formed on a bulk acoustic wave resonating part 1200 of a bulk acoustic wave resonator 1000, according to an embodiment. A thickness t8 of a portion h of at least one of first and second reflection layers 1061 and 1062 of the reflection layer 1060 is different from a thickness t7 of a remaining portion g.

In addition, thicknesses t2 and t4 of portions b and d, of one of first and second reflection layers 1031 and 1032 of a reflection layer 1030, which is formed below the bulk acoustic wave resonating part 1200, is different from thicknesses t1 and t3 of remaining portions a and c.

A protection layer 1050 is formed below the reflection layer 1030, and a thickness t6 of a portion f of the protection layer 1050 is different from a thickness t5 of a remaining portion e.

Figure 11A:
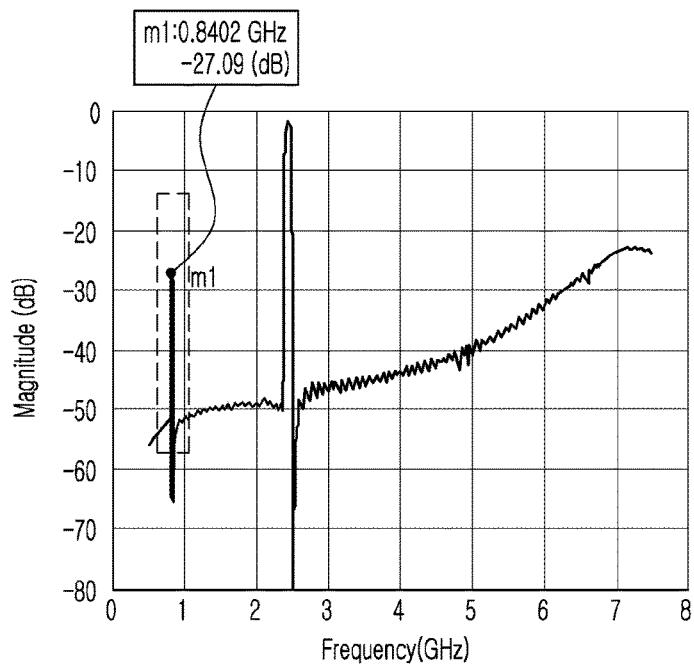
FIGS. 11A through 11C are graphs illustrating frequency characteristics of the bulk acoustic wave resonator, according to an embodiment.
Figure 11B:
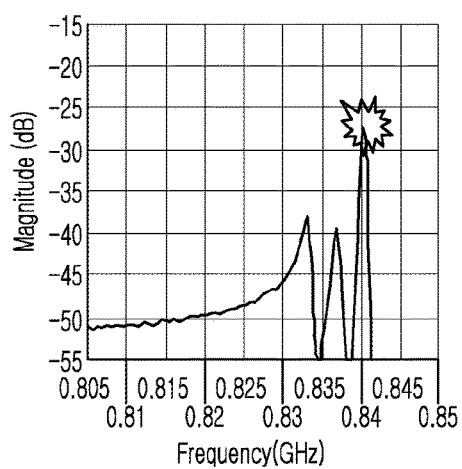
Figure 11C:
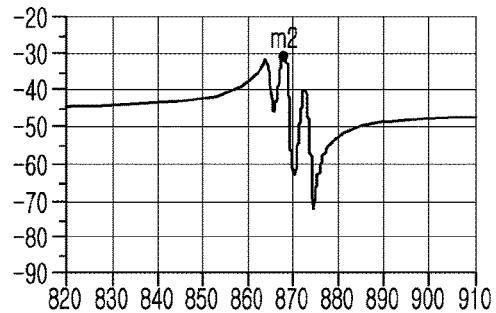

FIGS. 11A through 11C are graphs illustrating frequency characteristics of the bulk acoustic wave resonator, according to an embodiment.

Referring to FIG. 11A, in a case in which a specific frequency band of a bulk acoustic wave resonator or a filter is enlarged, according to an embodiment, it may be seen that a peak of an unwanted frequency band of about 840 MHz, as illustrated in FIG. 11B, is reduced as illustrated in FIG. 11C.

Figure 12:
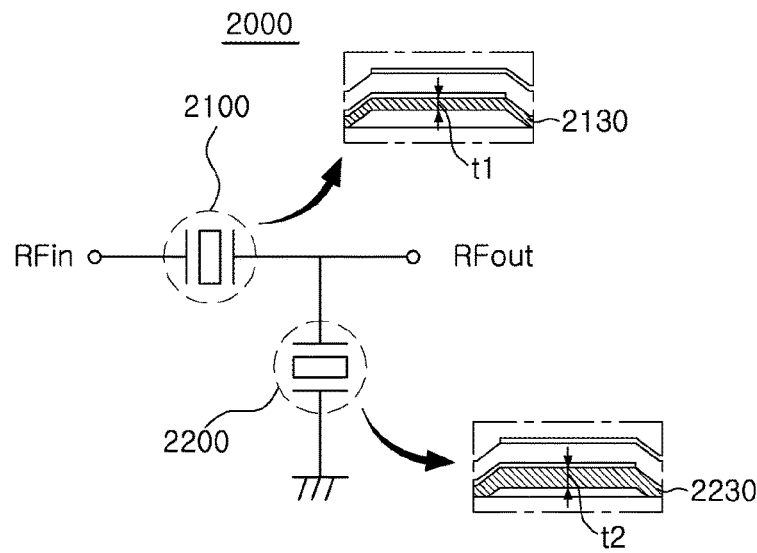
FIGS. 12 through 14 are schematic circuit diagrams of a filter, according to an embodiment.
Figure 13:
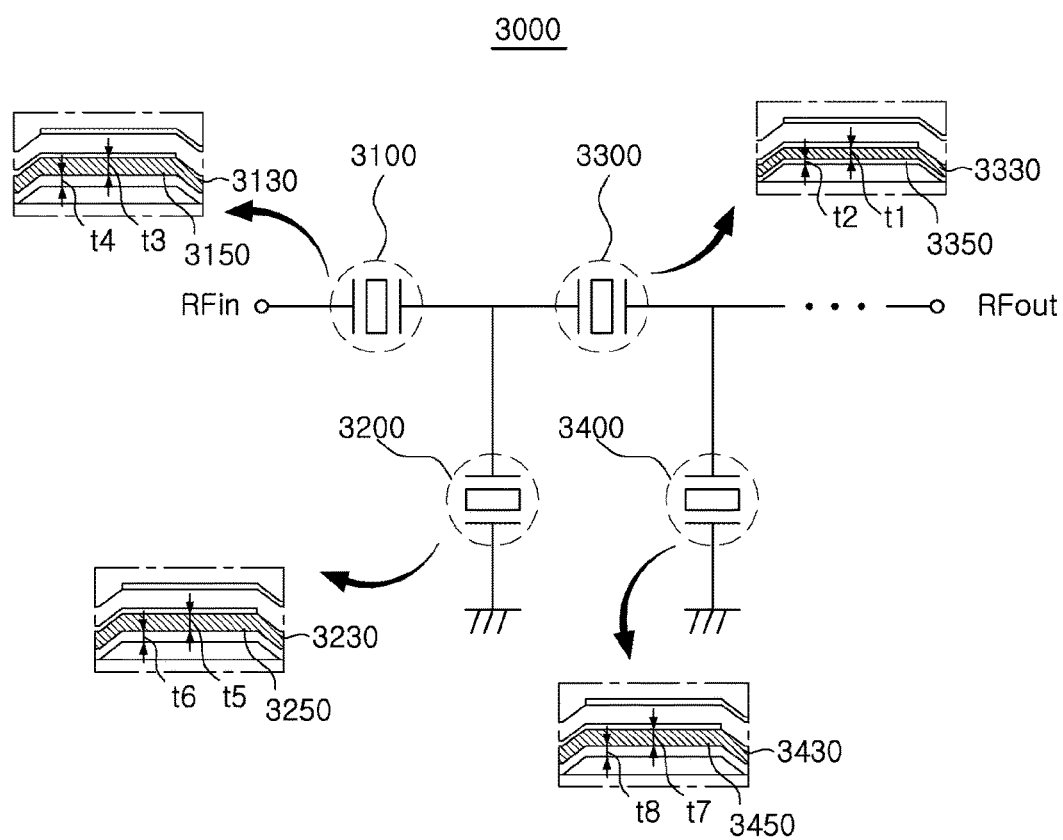
Figure 14:
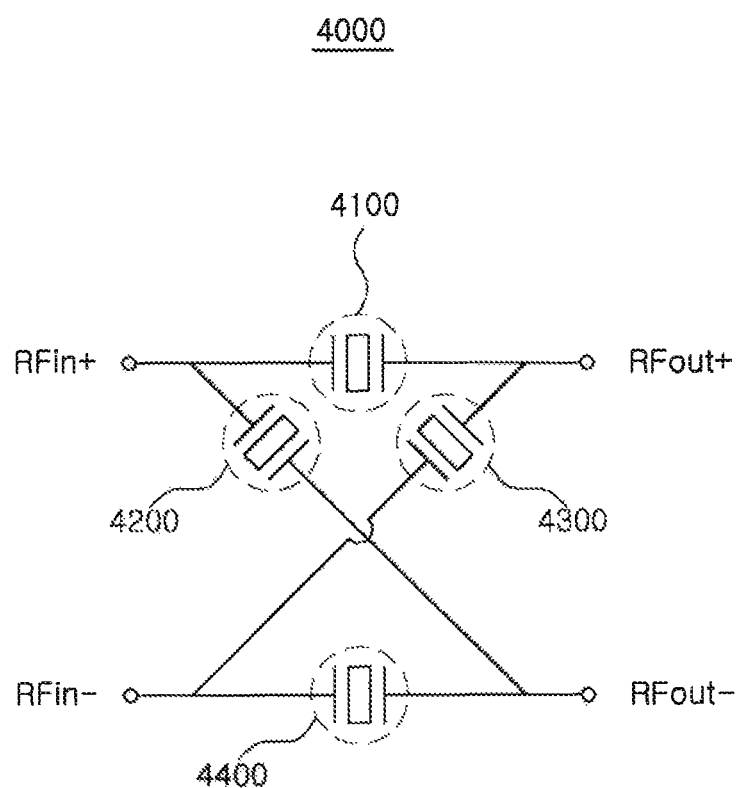

FIGS. 12 through 14 are schematic circuit diagrams of a filter, according to an embodiment.

Referring to FIG. 12, a filter 2000, according to an embodiment, includes a plurality of bulk acoustic wave resonators 2100 and 2200.

A first bulk acoustic wave resonator 2100 is connected in series between a signal input terminal, to which an input signal RFin is input, and a signal output terminal, from which an output signal RFout is output. A second bulk acoustic wave resonator 2200 is connected between the signal output terminal and a ground, such that the filter 2000 is formed in a ladder-type arrangement of a filter structure, in accordance with an embodiment.

For example, a thickness t1 of a reflection layer 2130 of the first bulk acoustic wave resonator 2100 is different from a thickness t2 of a reflection layer 2230 of the second bulk acoustic wave resonator 2200.

As illustrated in FIGS. 1 through 10, a thickness of a portion of the reflection layer of at least one of the plurality of bulk acoustic wave resonators 2100 and 2200 included in the filter 2000 is different from a thickness of a remaining portion. Thus, a peak of an unwanted frequency band of the filter 2000 is reduced.

Referring to FIG. 13, a filter 3000, according to an embodiment, includes a plurality of bulk acoustic wave resonators 3100, 3200, 3300, and 3400.

The plurality of bulk acoustic wave resonators 3100, 3200, 3300, and 3400 is formed in a ladder-type arrangement of filter structure, each of the plurality of bulk acoustic wave resonators 3100, 3200, 3300, and 3400 including reflection layers 3130, 3230, 3330, and 3430, and protection layers 3150, 3250, 3350, and 3450. In one example, a thickness of the reflection layer or the protection layer of at least one bulk acoustic wave resonator is different from thicknesses of reflection layers or protection layers of remaining bulk acoustic wave resonators.

For example, a thickness t1 of a reflection layer 3330 of the third bulk acoustic wave resonator 3300 or a thickness t2 of the protection layer 3350 is different from thicknesses t3, t5, and t7 of the reflection layers 3130, 3230, and 3430 of the first, second, and fourth bulk acoustic wave resonators 3100, 3200, and 3400, respectively. In the alternative, the thickness t1 of the reflection layer 3330 of the third bulk acoustic wave resonator 3300 or the thickness t2 of the protection layer 3350 is different from thicknesses t4, t6, and t8 of the protection layers 3150, 3250, and 3450, respectively.

As illustrated in FIGS. 1 through 10, a thickness of a portion of the reflection layer or the protection layer of at least one of the plurality of bulk acoustic wave resonators 3100, 3200, 3300, and 3400 included in the filter 3000 is different from a thickness of a remaining portion.

Referring to FIG. 14, a filter 4000, according to an embodiment, includes a plurality of bulk acoustic wave resonators 4100, 4200, 4300, and 4400.

The plurality of bulk acoustic wave resonators 4100, 4200, 4300, and 4400 are formed in a lattice-type arrangement of filter structure configured to filter a balanced input signal RFin+ and RFin− and output a balanced output signal RFout+ and RFout−. Similarly to those illustrated in FIGS. 12 and 13, a thickness of a reflection layer or a protection layer of at least one of the plurality of bulk acoustic wave resonators 4100, 4200, 4300, and 4400 of FIG. 14 may also be different from thicknesses of reflection layers or protection layers of the remaining bulk acoustic wave resonators.

As illustrated in FIGS. 1 through 10, a thickness of a portion of the reflection layer or the protection layer of at least one of the plurality of bulk acoustic wave resonators 4100, 4200, 4300, and 4400 included in the filter 4000 may be different from a thickness of a remaining portion.

As set forth above, according to embodiments, the bulk acoustic wave resonator and the filter include the temperature compensation function and reduce the noise peak.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator, comprising:
    a bulk acoustic wave resonating part comprising a piezoelectric layer; and
    a reflection layer configured to reflect waves generated by the piezoelectric layer based on a signal applied to the bulk acoustic wave resonating part; and
    an air cavity disposed under the entire bulk acoustic wave resonating part,
    wherein a thickness of the reflection layer is nonuniform, and
    wherein the reflection layer is disposed above and below the bulk acoustic wave resonating part, or below the bulk acoustic wave resonating part.

2. The bulk acoustic wave resonator of claim 1, wherein the reflection layer is disposed on one of an upper portion and a lower portion of the bulk acoustic wave resonating part.

3. The bulk acoustic wave resonator of claim 1, wherein the reflection layer is formed of regions, each having different thicknesses from a center thereof to an outer portion thereof.

4. The bulk acoustic wave resonator of claim 1, wherein the reflection layer comprises, a first reflection layer comprising a first acoustic impedance, and a second reflection layer comprising a second acoustic impedance, higher than the first acoustic impedance.

5. A bulk acoustic wave resonator, comprising:
    a bulk acoustic wave resonating part comprising a piezoelectric layer; and
    a reflection layer configured to reflect waves generated by the piezoelectric layer based on a signal applied to the bulk acoustic wave resonating part; and
    an air cavity disposed under the entire bulk acoustic wave resonating part,
    wherein a thickness of the reflection layer is nonuniform, and
    wherein the reflection layer comprises,
        a first reflection layer comprising a first acoustic impedance, and
        a second reflection layer comprising a second acoustic impedance, higher than the first acoustic impedance.

6. The bulk acoustic wave resonator of claim 5, wherein a thickness of a portion of one of the first reflection layer and the second reflection layer is different from a thickness of a remaining portion.

7. A bulk acoustic wave resonator, comprising:
    a bulk acoustic wave resonating part comprising a piezoelectric layer; and
    a reflection layer configured to reflect waves generated by the piezoelectric layer based on a signal applied to the bulk acoustic wave resonating part,
    a protection layer deposited on a substrate,
        wherein a thickness of a portion of the reflection layer is different from a thickness of a remaining portion thereof, and
        wherein a thickness of a portion of the protection layer is different from a thickness of a remaining portion thereof.

8. A bulk acoustic wave resonator, comprising:
   a bulk acoustic wave resonating part comprising a piezoelectric layer; and
   a reflection layer configured to reflect waves generated by the piezoelectric layer based on a signal applied to the bulk acoustic wave resonating part,
   a protection layer deposited on a substrate,
   wherein a thickness of a portion of the reflection layer is different from a thickness of a remaining portion thereof, and
   wherein the bulk acoustic wave resonating part is formed above the reflection layer and the protection layer and the protection layer is formed below the reflection layer.

9. A bulk acoustic wave resonator, comprising:
   a bulk acoustic wave resonating part comprising a piezoelectric layer; and
   a reflection layer configured to reflect waves generated by the piezoelectric layer based on a signal applied to the bulk acoustic wave resonating part,
   wherein a thickness of a portion of the reflection layer is different from a thickness of a remaining portion thereof,
   wherein the reflection layer is formed of regions evenly divided, where the thicknesses of the regions are different, and
   wherein the reflection layer is disposed above and below the bulk acoustic wave resonating part, or below the bulk acoustic wave resonating part.

10. A bulk acoustic wave resonator comprising:
    a bulk acoustic wave resonating part stacked on a substrate and comprising a piezoelectric layer;
    a reflection layer configured to reflect waves generated by the piezoelectric layer based on a signal applied to the bulk acoustic wave resonating part;
    a protection layer deposited on the substrate; and
    an air cavity disposed under the entire bulk acoustic wave resonating part,
    wherein a thickness of the reflection layer is nonuniform, and
    wherein the reflection layer is disposed above and below the bulk acoustic wave resonating part, or below the bulk acoustic wave resonating part.

11. The bulk acoustic wave resonator of claim 10, wherein the reflection layer is disposed on one of an upper portion and a lower portion of the bulk acoustic wave resonating part.

12. The bulk acoustic wave resonator of claim 10, wherein the reflection layer comprises:
    a first reflection layer comprising first acoustic impedance; and
    a second reflection layer comprising a second acoustic impedance, higher than the first acoustic impedance.

13. The bulk acoustic wave resonator of claim 12, wherein a thickness of a portion of one of the first reflection layer and the second reflection layer is different from a thickness of a remaining portion thereof.

14. A filter, comprising:
    bulk acoustic wave resonators configured to filter an input signal into frequency bands, wherein each of the bulk acoustic wave resonators comprises
    a bulk acoustic wave resonating part configured to produce a resonance frequency,
    an air cavity disposed under the entire bulk acoustic wave resonating part, and
    a reflection layer configured to reflect waves of the resonance frequency,
    wherein a thickness of a reflection layer of one of the bulk acoustic wave resonators is nonuniform, and
    wherein the reflection layer is disposed above and below the bulk acoustic wave resonating part, or below the bulk acoustic wave resonating part.

15. The filter of claim 14, wherein the bulk acoustic wave resonators are configured in a ladder-type arrangement or a lattice-type arrangement.

16. The filter of claim 14, wherein a TCF (temperature coefficient of frequency) of the bulk acoustic wave resonating part has a sign opposite a sign of a TCF of the reflection layer.

17. The filter of claim 14, wherein a thickness of a reflection layer of a first bulk acoustic wave resonator is different from a thickness of a reflection layer of a second bulk acoustic wave resonator.

18. A filter, comprising:
    bulk acoustic wave resonators configured to filter an input signal into frequency bands,
    wherein each of the bulk acoustic wave resonators comprises
    a bulk acoustic wave resonating part configured to produce a resonance frequency,
    an air cavity disposed under the entire bulk acoustic wave resonator part,
    a reflection layer configured to reflect waves of the resonance frequency, and
    a protection layer deposited on a substrate,
    wherein a thickness of a reflection layer of one of the bulk acoustic wave resonators is nonuniform, and
    wherein the reflection layer is disposed above and below the bulk acoustic wave resonating part, or below the bulk acoustic wave resonating part.

19. The filter of claim 18, wherein a thickness of a portion of the protection layer of the one of the bulk acoustic wave resonators is different from a thickness of a remaining portion thereof.

20. The filter of claim 18, wherein the bulk acoustic wave resonators are configured in a ladder-type arrangement or a lattice-type arrangement.

* * * * *